(12) United States Patent
Park et al.

(10) Patent No.: US 11,201,056 B2
(45) Date of Patent: Dec. 14, 2021

(54) PITCH MULTIPLICATION WITH HIGH PATTERN FIDELITY

(71) Applicant: International Business Machines Corporation, Armonk, NY (US)

(72) Inventors: Chanro Park, Clifton Park, NY (US); Koichi Motoyama, Clifton Park, NY (US); Kenneth Chun Kuen Cheng, Albany, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 36 days.

(21) Appl. No.: 16/822,334

(22) Filed: Mar. 18, 2020

(65) Prior Publication Data

US 2021/0296127 A1   Sep. 23, 2021

(51) Int. Cl.
*H01L 21/033* (2006.01)
*G03F 1/38* (2012.01)

(52) U.S. Cl.
CPC ............ *H01L 21/0338* (2013.01); *G03F 1/38* (2013.01); *H01L 21/0332* (2013.01); *H01L 21/0337* (2013.01)

(58) Field of Classification Search
CPC ............. H01L 21/0332; H01L 21/0337; H01L 21/0338; G03F 1/38
See application file for complete search history.

(56) References Cited

U.S. PATENT DOCUMENTS

| | | | |
|---|---|---|---|
| 7,842,601 B2 | 11/2010 | Lee et al. | |
| 9,378,975 B2 | 6/2016 | Parkinson et al. | |
| 9,679,771 B1 | 6/2017 | Chen | |
| 9,812,325 B2 | 11/2017 | Mohanty et al. | |
| 9,818,621 B2 | 11/2017 | Tavernier et al. | |
| 9,852,916 B2 | 12/2017 | Chen et al. | |
| 9,911,646 B2 | 3/2018 | Tsai et al. | |
| 2006/0240361 A1 | 10/2006 | Lee et al. | |
| 2014/0353718 A1 | 12/2014 | Loubet et al. | |
| 2015/0024597 A1 | 1/2015 | Gao et al. | |
| 2015/0228499 A1 | 8/2015 | Parkinson et al. | |
| 2016/0293438 A1 | 10/2016 | Zhou et al. | |
| 2016/0307768 A1 | 10/2016 | Chen et al. | |
| 2016/0307772 A1 | 10/2016 | Choi et al. | |
| 2017/0069495 A1 | 3/2017 | Mohanty et al. | |
| 2017/0200641 A1 | 7/2017 | Tsai et al. | |
| 2017/0243754 A1 | 8/2017 | Tavernier et al. | |
| 2019/0172718 A1 | 6/2019 | Kubota et al. | |
| 2020/0111669 A1* | 4/2020 | Zaitsu | .................. C23C 16/405 |

FOREIGN PATENT DOCUMENTS

KR    101691717 B1    12/2016
WO      044321 A2     8/2000

* cited by examiner

*Primary Examiner* — Walter H Swanson
(74) *Attorney, Agent, or Firm* — Cantor Colburn LLP; L. Jeffrey Kelly

(57) ABSTRACT

Methods and structures for pitch multiplication include forming a plurality of mandrel lines and non-mandrel lines on a target layer, wherein the non-mandrel lines include a protective spacer material about a top sidewall portion and a first spacer material about a lower sidewall portion, wherein the protective spacer material has a different etch selectivity than the first spacer material. The plurality of mandrel lines and non-mandrel lines are transferred into the target layer.

17 Claims, 5 Drawing Sheets

PITCH MULTIPLICATION WITH HIGH PATTERN FIDELITY

BACKGROUND

The present invention generally relates to semiconductor integrated circuits and a method of fabrication thereof, and more specifically, to methods for pitch multiplication with high pattern fidelity.

Current photolithography has reached its fundamental printing limits. To address this issue multiple patterning procedures have been proposed for feature size reduction. Multiple patterning techniques typically take the form of repeated lithography and etching procedures. For example, a typical patterning technique can include a lithography-etch-lithography-etch process for double patterning, and lithography-etch-lithography-etch-lithography-etching for triple patterning. The most common self-aligned multi-patterning technique is referred to as self-aligned double-patterning (SADP). The techniques used in SADP can also readily be extended to self-aligned quadruple-patterning (SAQP). The SADP process generally includes printing every other line at double the required pitch to accommodate lithography limitations. However, rather than printing the second set of interleaving lines using another mask, the SADP process creates them using deposition and etch processes that not only create, but also self-align these second lines without resorting to lithography. While there is still a second lithography operation, it is used to image a block/cut mask that defines the tip-to-tip gaps in the lines, creating the final shapes.

Self-aligned LELE (SALELE) is a form of double patterning, also referred to as a pitch splitting process, that combines aspects of both the self-aligned multi-patterning and litho-etch-litho-etch (LELE) processes. In SALELE, two separate lithography and etch steps are performed to define a single layer, thereby doubling the pattern density.

SUMMARY

Embodiments of the present invention are generally directed to self-aligned multi-patterning methods for pitch multiplication and structures utilized for pitch multiplication. A non-limiting example of a self-aligned multi-patterning method for pitch multiplication according to aspects of the invention includes conformally depositing a first spacer material onto a topographical pattern defined by a plurality of mandrel lines, wherein the plurality of mandrel lines is formed on an underlayer. A protective spacer material conformally deposited onto the topographical pattern, wherein the protective spacer material is different from the first spacer material. The protective spacer material is removed from horizontal surfaces of the first spacer material. The first spacer material is etched back to the underlayer to define sidewall spacers of the first spacer material on sidewalls of each of the plurality of mandrel lines and form a gap between adjacent sidewall spacers. The sidewall spacers include the protective spacer material at about a top portion. The gap is filled with a non-mandrel material to form non-mandrel lines. The sidewall spacers are anisotropically etched such that the non-mandrel lines include the protective spacer material about a top portion and the first spacer material about a bottom portion. The mandrel lines and non-mandrel lines are transferred into the underlayer to form a pattern.

A non-limiting example self-aligned multi-patterning method for pitch multiplication according to aspects of the invention includes conformally depositing a first spacer material onto a topographical pattern defined by a plurality of mandrel lines, wherein the plurality of mandrel lines is formed on an underlayer. A protective spacer material is conformally deposited onto the topographical pattern, wherein the protective spacer material is different from the first spacer material. The protective spacer material is removed from horizontal surfaces of the first spacer material. The first spacer material is etched back to the underlayer to define sidewall spacers of the first spacer material on sidewalls of each of the plurality of mandrel lines and form a gap between adjacent sidewall spacers. The sidewall spacers include the protective spacer material at about a top portion. The gap is filled with a non-mandrel material to form non-mandrel lines. The sidewall spacers are isotropically etched such that the non-mandrel lines include the protective spacer material about a top portion and an undercut region about a bottom portion. The mandrel lines and non-mandrel lines are transferred into the underlayer, wherein a width of the transferred non-mandrel lines is equal to a width of the non-mandrel material and the protective spacer material at about the top portion in the non-mandrel lines.

A non-limiting example method for structure for pitch multiplication according to aspects of the invention includes a substrate and a target layer overlying the substrate. A plurality of mandrel lines and non-mandrel lines are provided on the target layer, wherein the non-mandrel lines include a protective spacer material about a top sidewall portion and a first spacer material about a lower sidewall portion. The protective spacer material has a different etch selectivity than the first spacer material.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Prior Art

Prior art

DETAILED DESCRIPTION

Figure 1A:
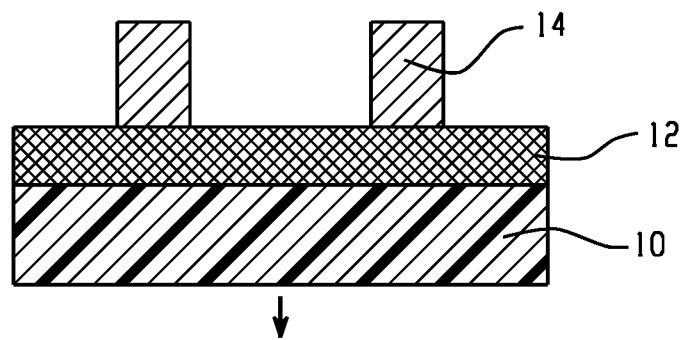
FIGS. 1A-1E depict successive cross-sectional views of an exemplary self-aligned double patterning scheme.
Figure 1B:
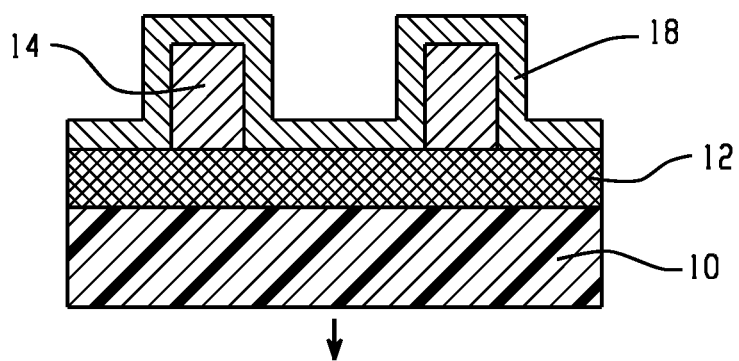
Figure 1C:
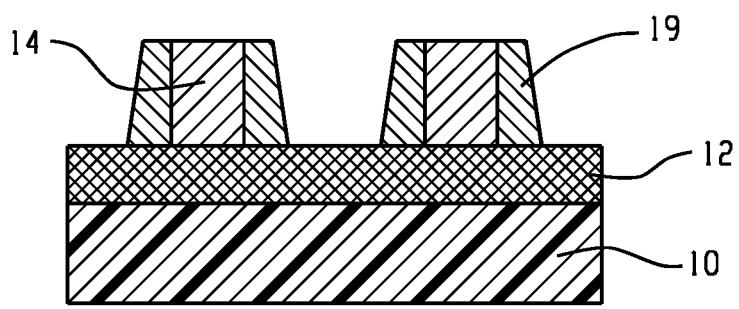
Figure 1D:
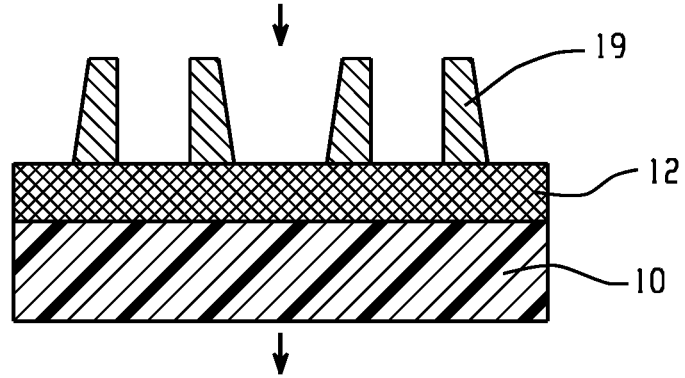
Figure 1E:
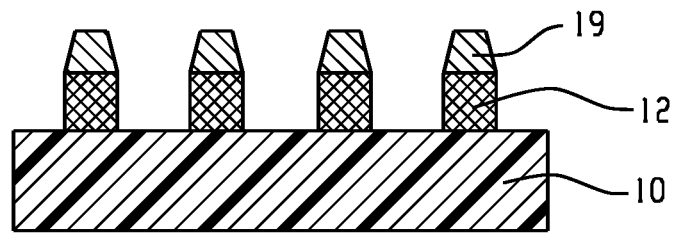
Figure 2A:
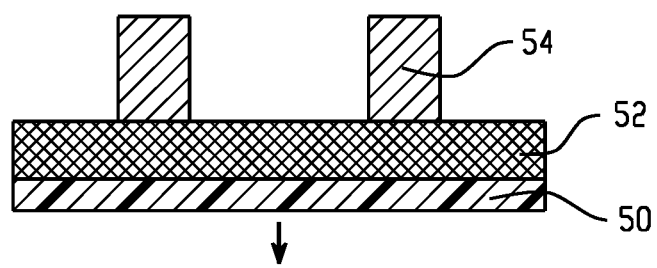
FIGS. 2A-2F depict successive cross-sectional views of an exemplary self-aligned litho-etch-litho-etch scheme.
Figure 2B:
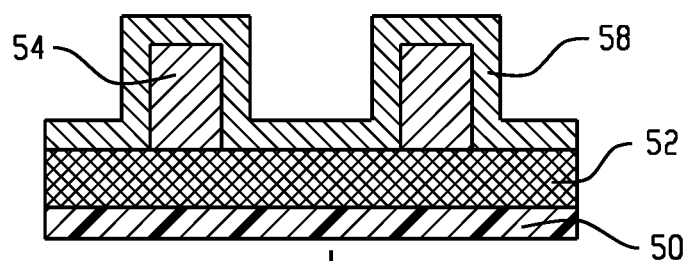
Figure 2C:
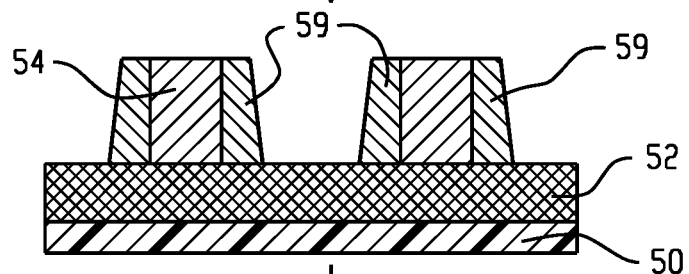
Figure 2D:
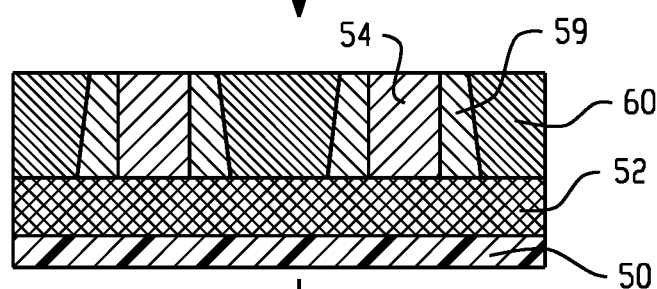
Figure 2E:
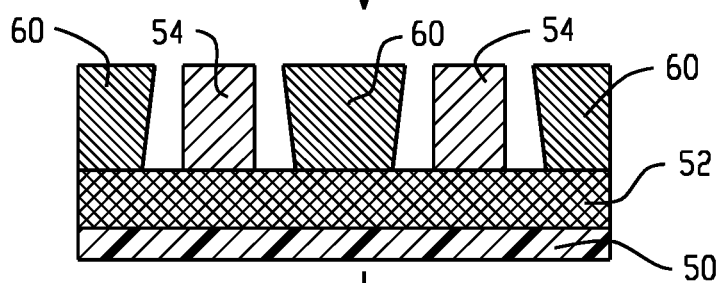
Figure 2F:
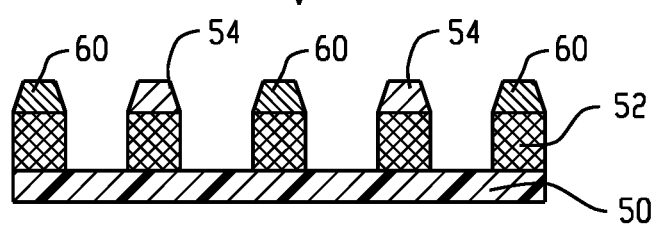

Pitch multiplication methods to double the frequency of a lithographic process can include using sacrificial sidewall spacers. A typical self-aligned double patterning process (SADP) uses sidewall spacers to create patterned hardmasks as a means of doubling the line density. An exemplary prior art SADP process is illustrated in Prior Art FIGS. 1A-1E, A layer of hardmask material 12 is deposited on a substrate 10, and a layer of mandrel material 14 (which can be a photoresist) is patterned into lines on the hardmask layer 12. A conformal layer of spacer material 18 is deposited on the tops and sides of the mandrel lines 14 and on the hardmask layer 12 in the gaps between the mandrel lines 14. The spacer material 18 is typically formed of an inorganic material, typically oxides like $Al_2O_3$. The spacer material on the tops of the mandrel lines 14 and in the gaps between the mandrel lines 14 is then removed by anisotropic etching, leaving the mandrel lines 14 with sidewalk of spacer material 19, i.e., sidewall spacers. The material defining the mandrel lines 14 is then removed, leaving lines of the sidewall spacer 19 on the hardmask layer 12, The number of lines of the sidewall spacers 19 is double the number of mandrel lines 14, and thus the pitch of the sidewall spacer lines 19 is half the pitch of the mandrel lines 14, hence the terms "line doubling" and "pitch halving". The sidewall spacers 19 are then used as an etch mask to transfer the line pattern into the hardmask 12 and subsequently removed, leaving a hardmask pattern of lines on the substrate 10. The critical dimension of the bottom spacer is generally well controlled and determines the final feature dimension. The tapered spacer profile is not much of a concern with respect to the final feature dimension.

However, in subtractive back end of line (BEOL) self-aligned litho-etch-litho-etch (SALELE) integration schemes, the sidewall spacer is removed by etching after mask assembly. Consequently, critical dimension and profile variation of the spacer significantly affects line and spacer width compared to prior art SADP processes.

An exemplary prior art SALELE process is illustrated in Prior Art FIGS. 2A-2F, which is not drawn to scale. A target layer 52, e.g., a metal layer, is deposited on a substrate 50, and a layer of mandrel material 54 (which can be a photoresist) is patterned into lines on the hardmask layer 52. A conformal layer of spacer material 58 is deposited on the tops and sides of the mandrel lines 54 and on the hardmask layer 52 in the gaps between the mandrel lines 54. The spacer material 58 on the tops of the mandrel lines 54 and in the caps between the mandrel lines 54 is then removed by anisotropic etching, leaving the mandrel lines 54 with spacer sidewalk 59 and gaps between adjacent sidewall spacers 59, which are filled with a non-mandrel material 60. The sidewall spacers 58 have a tapered profile because of erosion caused by the anisotropic etching process. The sidewall spacers 58 are then removed by etching leaving the non-mandrel material 60 with a reverse tapered profile. The target layer 52 is then etched. The top portion of the non-mandrel is eroded during pattern transfer and depending on the severity of the sidewall angle that is transferred to the non-mandrel during the sidewall spacer removal, the transferred feature size under the non-mandrel can vary, which is undesirable. Moreover, the mandrel lines, if formed of a different material than the non-mandrel lines, can have a different etch selectivity that can affect pattern transfer to the target layer, resulting in variances.

As will be discussed below in embodiments of the present invention, the multi-patterning process where the spacer sidewalls are removed by etching after mask assembly includes deposition of a second spacer material onto the sidewall spacers to prevent erosion during the spacer etch, which markedly reduces sidewall taper, i.e. reduces the spacer sidewall angle to be substantially vertical. As a result, the reduction in the spacer sidewall angle, i.e., taper, reduces feature size variation during pattern transfer of the non-mandrel mask features into the underlying metal layer. Advantageously, the sidewall spacer thickness is uniform and constant. Moreover, the sidewall spacer profile has a substantially vertical profile as opposed to a tapered profile such that the spacer sidewall profile is similar to the mandrel profile resulting in reliable pattern transfer with high fidelity.

Detailed embodiments of the integrated circuit structure and methods for fabricating the integrated circuit according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

Figure 3:
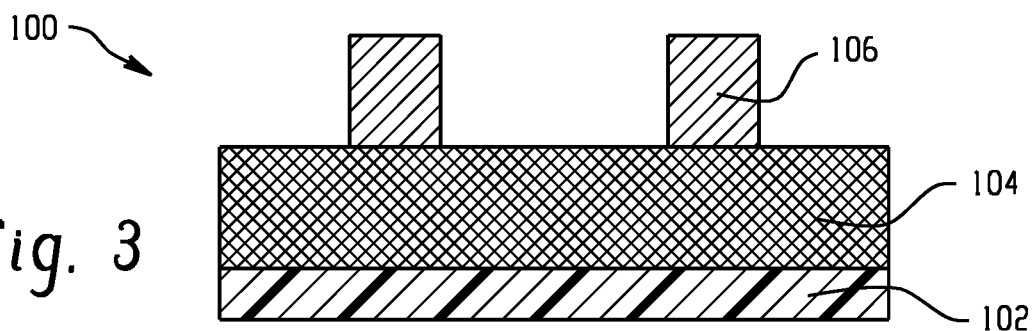
FIG. 3 depicts a cross-sectional view of a partial integrated circuit for forming a line pattern in a target layer using a multi-patterning process in accordance with one or more embodiments of the present invention.

Turning now to FIG. 3, a cross sectional view of a partial integrated circuit 100 suitable for forming a line pattern in a target layer using a multi-patterning process is depicted. The partial integrated circuit includes a target layer 104 on a substrate 102, and a layer of mandrel material is patterned into mandrel lines 106 on the target layer 104. For simplicity, the via and line end cut processes are omitted.

The substrate 102 is not intended to be limited and can include front end of line devices, middle of the line contact or plug structures, or back end of line interconnect structures. An exemplary substrate 102 is formed from semiconductor material such as silicon, including the relatively pure silicon materials typically used in the semiconductor industry as well as silicon admixed with other elements, such as germanium and the like. Alternatively, the substrate 102 can include germanium, gallium arsenide, and the like, or the substrate 102 can include layers of different semiconductor materials. The substrate 102 can be a bulk silicon or silicon-on-insulator (SOI) wafer. In one or more embodiments, the substrate 102 can be any semiconductor wafer mentioned above, with front-end of line devices and middle-of-line contacts processed, ready for back end of line interconnect processing.

The target layer 104 can be a metal layer, for example. Suitable metals include conductive metals such as copper, tungsten ruthenium, iridium, rhodium, molybdenum, cobalt, aluminum, combinations thereof, and alloys thereof. The metal layer can be formed by CVD, sputtering, electrochemical deposition or like processes.

The mandrel lines 106 can be formed of a mandrel material deposited by CND, PECVD, PVD, a spin-on process, or combinations thereof, wherein a blanket layer of the mandrel material is deposited. In one or more embodiments, the mandrel lines 106 is a sacrificial material that can be easily lithographically patterned and etched as well as provide good profile control. The mandrel lines 106 can be formed of a mandrel material including, but not limited to, amorphous silicon (a-Si), poly-silicon (p-Si), amorphous carbon (a-C), silicon-germanium (SiGe), an organic planarization layer (OFT), oxide (SiO), silicon nitride (SiN), or suitable combinations thereof or any type of organic or inorganic material having the desired etch selectivity relative to the target layer 104.

The mandrel lines can be patterned using e-beam lithography, optical lithography, imprint lithography, directed self-assembly of block copolymers, a spatial line frequency doubling process, or a combination thereof, and related etch techniques. In one or more embodiments, the lines as shown formed in the mandrel material 106 can have a linewidth of less than 15 nm.

Figure 4:
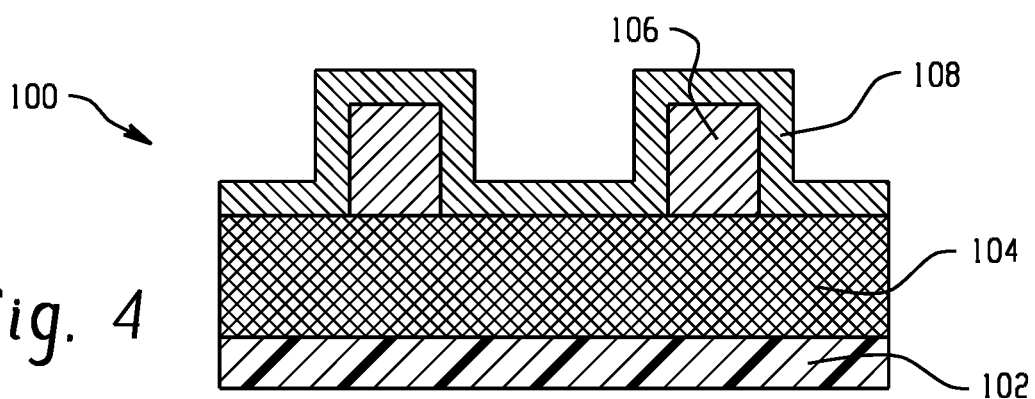
FIG. 4 depicts a cross-sectional view of the integrated circuit of FIG. 3 subsequent to conformal deposition of a first spacer layer in accordance with one or more embodiments of the present invention.

FIG. 4 is a cross sectional view of the partial integrated circuit 100 of FIG. 3 subsequent to deposition of a conformal of spacer layer 108 on the tops and sides of the mandrel lines 106 and on the target layer 104 in the gaps between the mandrel lines 106. The conformal spacer layer 108 can be deposited by, for example, atomic layer deposition or plasma enhanced atomic layer deposition, to control the thickness of the spacer material 108. Suitable materials for defining the conformal spacer layer 108 are not intended to be limited and is generally chosen based on etch selectivity to the mandrel (and non-mandrel as will be discussed in greater detail below) and the target layer 104. In one or more embodiments, the conformal spacer layer 108 can be silicon oxide (SiO), silicon nitride (SiN), silicon oxynitride (SiON), silicon carbide (SiC), amorphous carbon (a-C), or combinations thereof.

Figure 5:
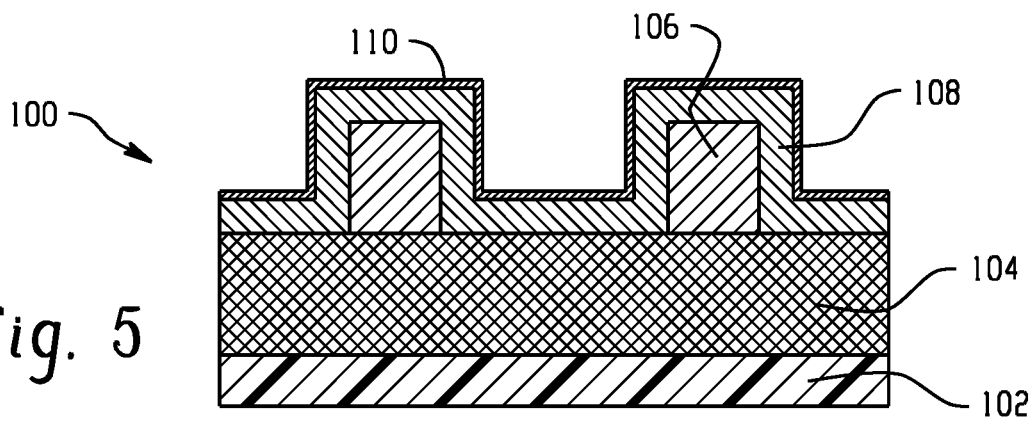
FIG. 5 depicts a cross-sectional view of the integrated circuit of FIG. 4 subsequent to conformal deposition of a protective spacer layer on the first spacer layer in accordance with one or more embodiments of the present invention.

FIG. 5 is a cross sectional view of the partial integrated circuit 100 of FIG. 4 subsequent to conformal deposition of a protective spacer material 110 on the conformal spacer material 108. The protective spacer material 110 is not intended to be limited and can be the same as or a different material as the non-mandrel material (see FIG. 8). The second protective spacer material 110 is a relatively thin layer and protects the top portion of the conformal spacer layer 108 during subsequent etchback to define the sidewall spacers so as to maintain a vertical profile. In one or more embodiments, the protective spacer material 110 is selected to have a greater etch selectivity than the conformal spacer layer 108. Exemplary spacer materials for forming the protective spacer layer 110 include, without limitation, aluminum oxide (AlO), hafnium oxide (HfO), zirconium oxide (ZrO), titanium oxide (TiO), titanium nitride (TiN), silicon nitride (SiN), silicon oxide (SiO) or the like.

Figure 6:
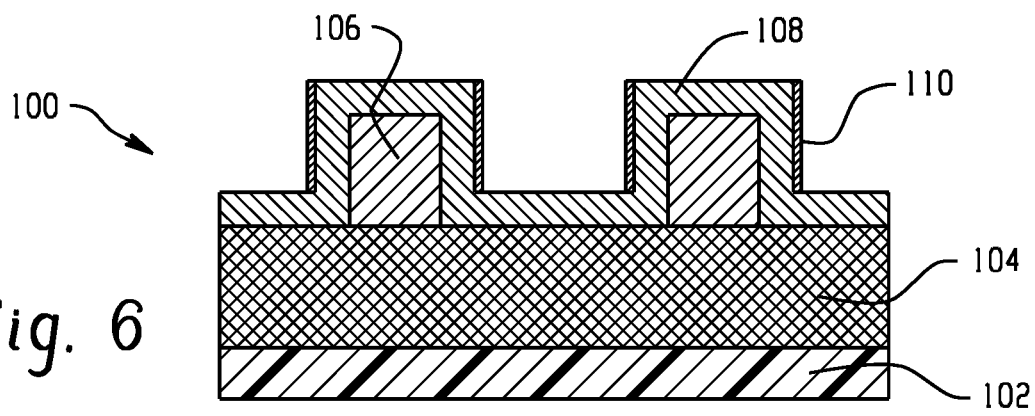
FIG. 6 depicts a cross-sectional view of the integrated circuit of FIG. 5 subsequent to protective spacer etch in accordance with one or more embodiments of the present invention.

FIG. 6 is a cross sectional view of the partial integrated circuit 100 of FIG. 5 subsequent to etching of the protective spacer material 110 from horizontal surfaces of conformal spacer material 108, wherein the etching process can be either selective or non-selective to spacer material 108. By way of example, a directional etch such as reactive ion etch can be used to remove the protective spacer material 110 from the horizontal surfaces of the conformal spacer material.

Figure 7:
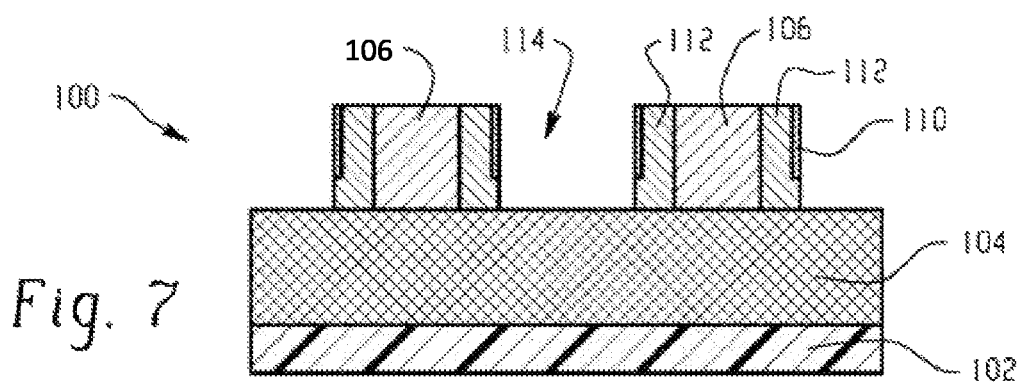
FIG. 7 depicts a cross-sectional view of the integrated circuit of FIG. 6 subsequent to first spacer etchback in accordance with one or more embodiments of the present invention.

FIG. 7 is a cross sectional view of the partial integrated circuit 100 of FIG. 6 subsequent to etch back of the conformal spacer layer 108 to the target layer 104 so as to define sidewall spacers 112. The etch back process selective removes the spacer material 108 on top surfaces of the mandrel lines 106 and on the target layer 104 so as to confine the conformal spacer layer 108 to the sidewalls of the mandrel lines 106, i.e., defines sidewall spacers 112. As shown, the presence of the protective spacer material 110 protects the top portion of the sidewall spacer 110 from eroding during the etchback process, which maintains a substantially vertical profile to the sidewall spacer 108. Gaps 114 are formed between adjacent sidewalls spacers 112 as shown.

Figure 8:
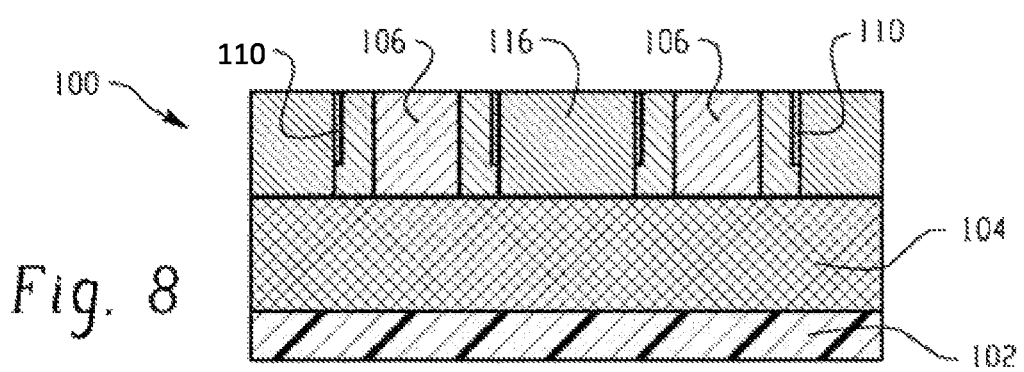
FIG. 8 depicts a cross-sectional view of the integrated circuit of FIG. 7 subsequent to non-mandrel deposition and planarization in accordance with one or more embodiments of the present invention.

FIG. 8 is a cross sectional view of the partial integrated circuit 100 of FIG. 7 subsequent to deposition of a non-mandrel material filling the gaps 114 to form non-mandrel lines 116 followed by planarization. The non-mandrel material is selected to provide good gap fill capability, etch selectively to the target layer 104, and ech selectivity to the sidewall spacers 112. Suitable non-mandrel materials include, without limitation, spin-on-glass (SOG), silicon oxide (SiO), silicon nitride (SiN), aluminum oxide (AlO), zirconium oxide (ZrO), hafnium oxide (HfO), titanium oxide (TiO), titanium nitride (TiN), tantalum nitride (TaN) or the like. The planarization process is utilized subsequent to deposition of the non-mandrel material into the gaps 114. By way of example, the surface can be planarized using a chemical mechanical polishing (CMP) process. The CMP process planarizes the surface by a combination of chemical and mechanical forces using a non-selective slurry composition generally known in the art. The slurry composition contains a silica abrasive material, which removes the different materials layers at substantially the same rate. Alternatively, a planar surface can be formed by a non-selective plasma etching process.

Figure 9:
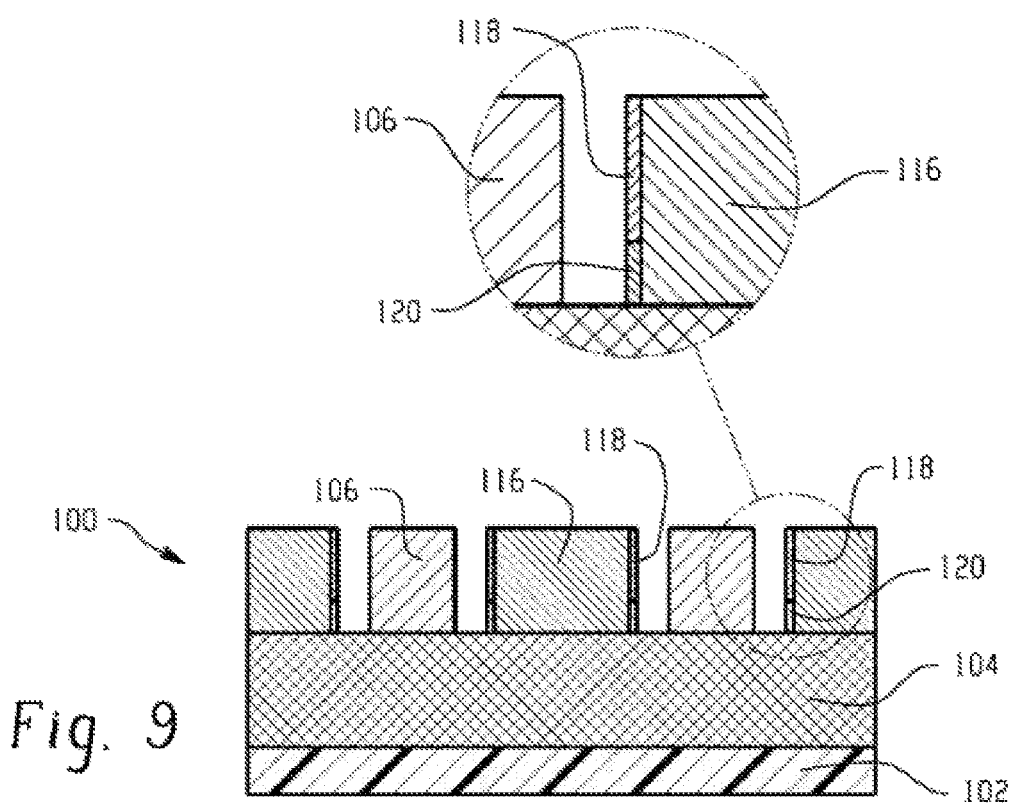
FIG. 9 depicts a cross-sectional view of the integrated circuit of FIG. 8 subsequent to anisotropic etch of the first spacer in accordance with one or more embodiments of the present invention.

FIG. 9 is a cross sectional view of the partial integrated circuit 100 of FIG. 8 subsequent to removal of the sidewall spacer 112 using an anisotropic etch process such as a reactive ion etch process. Subsequent to the anisotropic etch process, the spacer sidewalls of the non-mandrel will include a thin layer 118 of the protective spacer material 110 at about a top portion and a thin layer of the spacer material 112 at about a lower portion 120 extending to the target layer 104. The lower portion 120 is representative of the spacer material 112 underlying the protective spacer material 110, which is not removed during the highly directional anisotropic etch process. Advantageously, both the non-mandrel lines 116 as well as the mandrel lines 106 have a substantially vertical profile.

Figure 10:
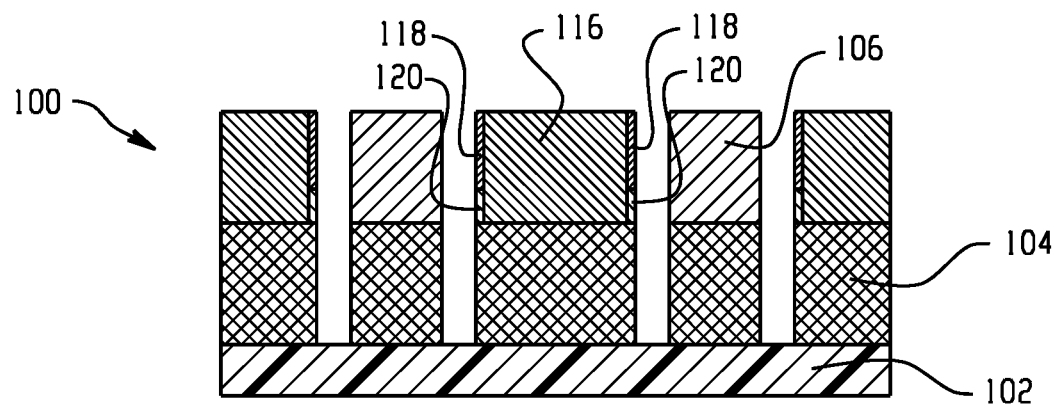
FIG. 10 depicts a cross-sectional view of the integrated circuit of FIG. 9 subsequent to transfer of the mandrel lines and the non-mandrel lines into the target layer in accordance with one or more embodiments of the present invention.

FIG. 10 is a cross sectional view of the partial integrated circuit 100 of FIG. 9 subsequent to pattern transfer into the target layer 104 to the substrate 102 using, for example, a directional etch process. Because the mandrel lines 106 and the non-mandrel lines 116 (including portions 118, 120 on sidewalls thereof) have a substantially vertical profile, pattern transfer results in excellent pattern transfer fidelity.

Figure 11:
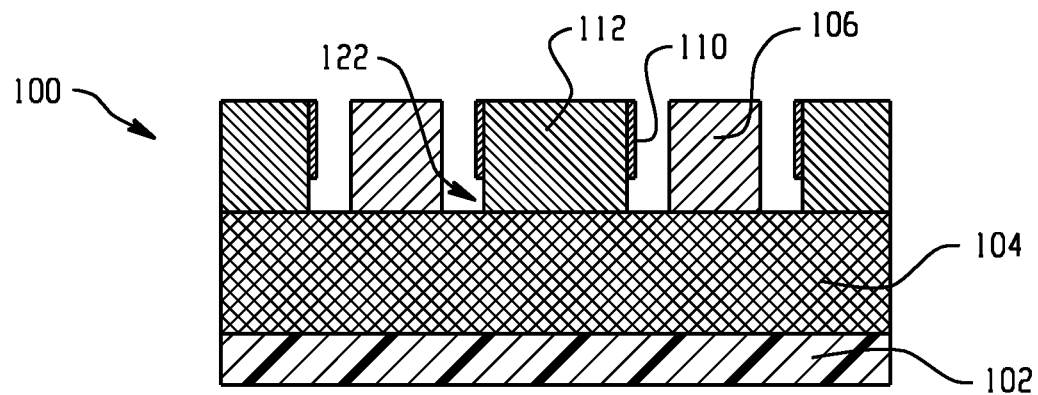
FIG. 11 depicts a cross-sectional view of the integrated circuit of FIG. 8 subsequent to isotropic etch of the first spacer in accordance with one or more embodiments of the present invention.

In accordance with another embodiment, FIG. 11 is a cross sectional view of the partial integrated circuit 100 of FIG. 8 subsequent to removal of the sidewall spacer 112 using an isotropic etch process, which can be a wet or a dry etch process. The isotropic etch of the sidewall spacer 112 results in a recess or space 122 under the protective spacer material 110.

Figure 12:
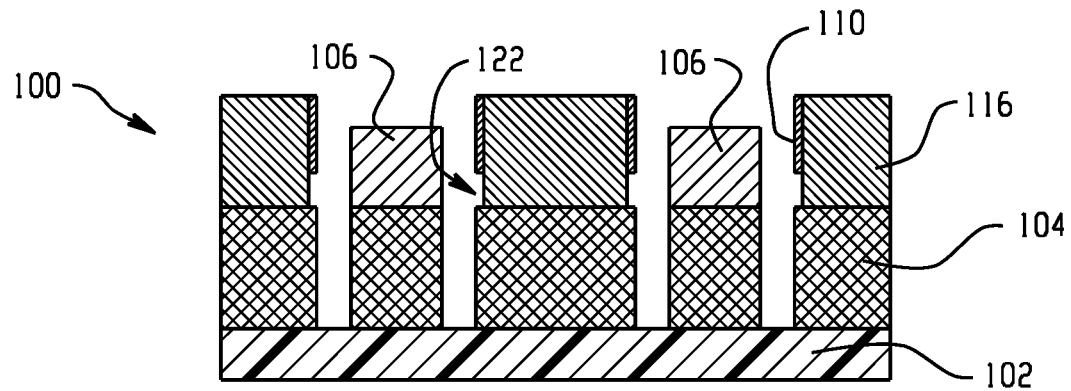
FIG. 12 depicts a cross-sectional view of the integrated circuit of FIG. 11 subsequent to transfer of the mandrel lines and the non-mandrel lines into the target layer with one or more embodiments of the present invention.

FIG. 12 is a cross sectional view of the partial integrated circuit 100 of FIG. 11. subsequent to pattern transfer. As is shown, the undercut formed by the recess or space 122 in the sidewall of the non-mandrel line 116 advantageously does not affect the etch profile in the target layer 104, which provides vertical sidewalls similar to those provided by the anisotropic etch for sidewall spacer removal in FIG. 10, which provides greater latitude in processing. The presence of the protective spacer material 110 at the top portion of the non-mandrel line 116 in addition to the width of the non-mandrel line defines the critical dimension of the lines formed in the target layer.

The descriptions of the various embodiments of the present invention have been presented for purposes of illustration but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A self-aligned multi-patterning method for pitch multiplication comprising:
conformally depositing a first spacer material onto a topographical pattern defined by a plurality of mandrel lines, wherein the plurality of mandrel lines is formed on an underlayer;
conformally depositing a protective spacer material onto the topographical pattern, wherein the protective spacer material is different from the first spacer material;
removing the protective spacer material from horizontal surfaces of the first spacer material;
etching back the first spacer material to the underlayer to define sidewall spacers of the first spacer material on sidewalls of each of the plurality of mandrel lines and form a gap between adjacent sidewall spacers, wherein the sidewall spacers include the protective spacer material at about a top portion;
filling the gap with a non-mandrel material to form non-mandrel lines;
anisotropically etching the sidewall spacers such that the non-mandrel lines include the protective spacer material about a top portion and the first spacer material about a bottom portion; and
transferring the mandrel lines and non-mandrel lines into the underlayer to form a pattern.

2. The method of claim 1, wherein the non-mandrel lines have a substantially vertical profile subsequent to the anisotropic etching of the sidewall spacers.

3. The method of claim 1, wherein the first spacer material comprises silicon oxide, silicon nitride, silicon oxynitride, silicon carbide, or amorphous carbon (a-C) and the protective spacer material comprises aluminum oxide, hafnium oxide, zirconium oxide, titanium oxide, silicon nitride, or silicon oxide.

4. The method of claim 1, wherein the underlayer comprises a conductive metal.

5. The method of claim 4, wherein the conductive metal comprises copper, tungsten ruthenium, iridium, rhodium, molybdenum, cobalt, aluminum, combinations thereof, or alloys thereof.

6. The method of claim 1, wherein the patterned underlayer comprises an interconnect structure.

7. The method of claim 1, wherein the underlayer comprises front-end of line devices or middle-of-line contacts.

8. The method of claim 1, wherein anisotropically etching the sidewall spacers comprises a reactive ion etch process.

9. The method of claim 1, wherein the mandrel lines are formed of a material comprising amorphous silicon, polysilicon, amorphous carbon, silicon-germanium, an organic planarization layer, silicon oxide, or silicon nitride.

10. A self-aligned multi-patterning method for pitch multiplication comprising:
conformally depositing a first spacer material onto a topographical pattern defined by a plurality of mandrel lines, wherein the plurality of mandrel lines is formed on an underlayer;
conformally depositing a protective spacer material onto the topographical pattern, wherein the protective spacer material is different from the first spacer material;
removing the protective spacer material from horizontal surfaces of the first spacer material;
etching back the first spacer material to the underlayer to define sidewall spacers of the first spacer material on sidewalls of each of the plurality of mandrel lines and form a gap between adjacent sidewall spacers, wherein the sidewall spacers include the protective spacer material at about a top portion;
filling the gap with a non-mandrel material to form non-mandrel lines;

isotropically etching the sidewall spacers such that the non-mandrel lines include the protective spacer material about a top portion and an undercut region about a bottom portion; and transferring the mandrel lines and non-mandrel lines into the underlayer, wherein a width of the transferred non-mandrel lines is equal to a width of the non-mandrel material and the protective spacer material at about the top portion in the non-mandrel lines.

11. The method of claim 10, wherein the non-mandrel lines have a substantially vertical profile subsequent to the isotropic etching of the sidewall spacers.

12. The method of claim 10, wherein the first spacer material comprises silicon oxide, silicon nitride, silicon oxynitride, silicon carbide, or amorphous carbon (a-C) and the protective spacer material comprises aluminum oxide, hafnium oxide, zirconium oxide, titanium oxide, silicon nitride, or silicon oxide.

13. The method of claim 10, wherein the underlayer comprises a conductive metal.

14. The method of claim 13, wherein the conductive metal comprises copper, tungsten ruthenium, iridium, rhodium, molybdenum, cobalt, aluminum, combinations thereof, or alloys thereof.

15. The method of claim 10, wherein the patterned underlayer comprises an interconnect structure.

16. The method of claim 10, wherein the underlayer is deposited onto a substrate, wherein the substrate comprises front-end of line devices or middle-of-line contacts.

17. The method of claim 10, wherein the mandrel lines are formed of a material comprising amorphous silicon, polysilicon, amorphous carbon, silicon-germanium, an organic planarization layer, silicon oxide, or silicon nitride.

* * * * *